(12) United States Patent
Farkas et al.

(10) Patent No.: US 6,274,478 B1
(45) Date of Patent: Aug. 14, 2001

(54) METHOD FOR FORMING A COPPER INTERCONNECT USING A MULTI-PLATEN CHEMICAL MECHANICAL POLISHING (CMP) PROCESS

(75) Inventors: Janos Farkas; Brian G. Anthony, both of Austin; Abbas Guvenilir, Round Rock; Mohammed Rabiul Islam, Austin; Venkat Kolagunta, Austin; John Mendonca, Austin; Rajesh Tiwari, Plano; Suresh Venkatesan, Austin, all of TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/352,136

(22) Filed: Jul. 13, 1999

(51) Int. Cl.[7] .................................................. H01L 21/4763
(52) U.S. Cl. ......................... 438/626; 438/597; 438/622; 438/633; 438/687; 438/693
(58) Field of Search .................................. 51/308; 134/7; 156/636, 636.1; 216/38; 257/635; 356/237; 438/627, 693, 622, 633, 687, 626; 451/41, 57

(56) References Cited

U.S. PATENT DOCUMENTS

| | | | |
|---|---|---|---|
| 5,340,370 | * 8/1994 | Cadien et al. | 51/308 |
| 5,389,194 | * 2/1995 | Rostoker et al. | 156/636 |
| 5,478,436 | * 12/1995 | Winebarger et al. | 156/636.1 |
| 5,527,423 | * 6/1996 | Neville et al. | 156/636.1 |
| 5,676,587 | * 10/1997 | Landers et al. | 451/57 |
| 5,739,579 | * 4/1998 | Chiang et al. | 257/635 |
| 5,770,095 | * 6/1998 | Sasaki et al. | 216/38 |
| 5,836,806 | * 11/1998 | Cadien et al. | 451/41 |
| 5,858,813 | * 1/1999 | Scherber et al. | 438/693 |
| 5,893,756 | * 4/1999 | Berman et al. | 438/692 |
| 5,897,375 | * 4/1999 | Watts et al. | 438/693 |
| 5,904,159 | * 5/1999 | Kato et al. | 134/7 |
| 5,909,276 | * 6/1999 | Kinney et al. | 356/237 |
| 6,001,730 | * 12/1999 | Farkas et al. | 438/627 |
| 6,004,188 | * 12/1999 | Roy | 451/41 |

* cited by examiner

*Primary Examiner*—Charles Bowers
*Assistant Examiner*—Asok Kumar Sarkar
(74) *Attorney, Agent, or Firm*—Robert A. Rodriguez

(57) ABSTRACT

A copper interconnect polishing process begins by polishing (17) a bulk thickness of copper (63) using a first platen. A second platen is then used to remove (19) a thin remaining interfacial copper layer to expose a barrier film (61). Computer control (21) monitors polish times of the first and second platen and adjusts these times to improve wafer throughput. One or more platens and/or the wafer is rinsed (20) between the interfacial copper polish and the barrier polish to reduce slurry cross contamination. A third platen and slurry is then used to polish away exposed portions of the barrier (61) to complete polishing of the copper interconnect structure. A holding tank that contains anti-corrosive fluid is used to queue the wafers until subsequent scrubbing operations (25). A scrubbing operation (25) that is substantially void of light is used to reduce photovoltaic induced corrosion of copper in the drying chamber of the scrubber.

9 Claims, 5 Drawing Sheets

METHOD FOR FORMING A COPPER INTERCONNECT USING A MULTI-PLATEN CHEMICAL MECHANICAL POLISHING (CMP) PROCESS

FIELD OF THE INVENTION

The present invention relates generally to semiconductor manufacturing, and more particularly to, forming a copper/tantalum interconnect over an integrated circuit (IC) using a multiple-platen CMP process.

BACKGROUND OF THE INVENTION

In the integrated circuit (IC) industry, lithographically patterned and etched aluminum interconnects are now being replaced with more advanced inlaid copper interconnects. While copper interconnects offer significant advantages over aluminum interconnects, such as improved electromigration resistance and reduced resistivity, the use of copper interconnects is exposing various unique problems in the IC industry. For example, barrier materials were not needed for aluminum interconnects. However, for copper, the industry has generally determined that barrier materials are required in order to make a high yielding copper interconnect that are reliable. Generally, tantalum barrier layers have become an optimal choice for barrier materials when creating copper interconnects. However, tantalum material requires a much different polishing slurry than copper material, whereby new cross contamination issues now exist between platens of a copper interconnect CMP system. Such contamination issues did not exist for aluminum interconnects.

In addition, it has been difficult to achieve improved planarity and reduced defectivity in many copper CMP interconnect processes. Also, due to the presence of more layers within a copper interconnect structure as compared to an aluminum interconnect structure, the throughput of copper processing needs further improvement. In addition, copper has proven to be a more environmentally sensitive material in an integrated circuit fabrication facility whereby adverse corrosion and defects due to ambient exposure and exposure to light has created certain unique manufacturing problems which now need to be addressed by the industry. These unique problems were not at issue in previous aluminum CMP processes and cannot be adequately dealt with by adopting preexisting aluminum CMP techniques.

As an example of the lack of compatibility with aluminum CMP and copper CMP, aluminum materials do not require polishing via several different chemically incompatible slurries whereby cross contamination between slurries becomes an issue. In addition, corrosive effects on aluminum when exposed to an ambient environment or to light are non-existent. Further, the aluminum buffing or polishing processes used previously in the art to perfect surface topographies in aluminum interconnects have been shown to cause significant leakage current in copper devices due to the presence of potassium. Also, the pH shock of these preexisting aluminum CMP slurries is non-optimal for use in copper processing. In fact, some prior art aluminum and copper CMP processes are adjusted to a pH range which results in significant and adverse corrosion of the copper interconnect over time. Reduction of copper corrosion is clearly desired in the industry.

Therefore, there exists in the industry a need for an improved CMP chemical mechanical polishing (CMP) process.

Figure 1:
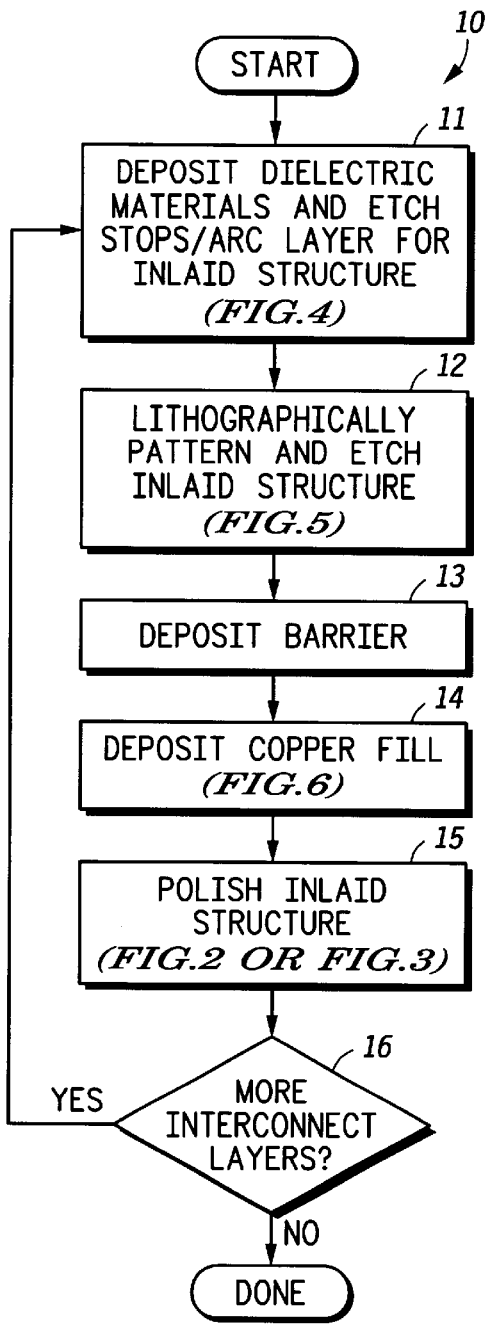
FIG. 1 illustrates, in a flow chart, a high level process flow that is used to form a plurality of stacked inlaid copper interconnects over an integrated circuit (IC) substrate.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

Description of a Preferred Embodiment

Generally, FIGS. 1–9 herein teach an improved chemical mechanical polishing (CMP) process that may be used to form copper interconnects over a semiconductor substrate. A "two-step" copper (Cu) and tantalum (Ta) CMP embodiment and a "three-step" copper tantalum copper CMP embodiment is taught herein via FIGS. 2 and 3 respectively. These two interchangeable processes have been shown to provide better planarity and/or reduced defectivity in copper interconnects. In addition, the copper polishing slurry and the tantalum barrier polishing slurry, when used in prior art systems, would generally result in adverse cross-contamination between CMP platens. The process taught herein implements unique rinsing operations of both the wafer and various platens at various stages during CMP process to reduce slurry cross-contamination.

In addition, the CMP processes taught herein is generally designed to reduce intrinsic potassium contamination and copper smearing along surfaces of the interconnect structure whereby leakage currents are reduced in copper IC structures. Furthermore, an improved holding tank that utilizes anti-corrosive fluids as well as the implementation of light-reduced post CMP scrubbing techniques ensures that copper corrosion on processed copper interconnects are completely prevented or at least reduced when using an embodiment taught herein. In addition, a multiple platen is coupled with a computer feed back mechanism in one embodiment of the CMP process taught herein where such a feedback mechanism can significantly improve wafer throughput and maintain a high level of throughput during CMP processing. Furthermore, the CMP slurries taught herein are engineered within a specific range of pH in order to reduce or optimize pH shock disadvantages, interconnect contamination, and/or corrosion of copper interconnects.

Specific process details can be better understood with specific references to FIGS. 1–9 hereinbelow.

FIG. 1 teaches a process 10 that is used to form a plurality of copper-based interconnects over an integrated circuit (IC) wafer or like substrate. Process 10 of FIG. 1 begins by providing a substrate within or prior to step 11. The substrate is any material on which electrical circuitry can be formed or supported. In one form, the substrate is one or more of a silicon wafer, a silicon on insulator (SOI) substrate, germanium material, gallium arsenide, other III–V compounds, epitaxial materials, silicon carbide, or like substrate materials. On top of this substrate material is formed various active, passive, and/or mechanical devices along with associated conductive interconnects. These IC devices formed over the substrate are to be interconnected to each other and to external integrated circuit terminals by the copper inlaid structures. The copper inlaid structures are formed by the process specifically illustrated via FIG. 1.

In order to enable formation of these conductive IC interconnects, step 11 involves the deposition of dielectric materials, dielectric or organic etch stop layers, and/or antireflective coatings (ARC) for use in defining one or more inlaid structures. The inlaid structures formed herein may be single inlaid structures, dual inlaid structures, or other inlaid structures which are useful for connecting one electrical or mechanical device to another device over a substrate. Generally, the dielectric materials used to define inlaid structures include one or more of tetraethylorthosilicate (TEOS) glass, fluorinated TEOS, borophosphosilicate glass (BPSG), other doped oxides, spin on glasses (SOGs), dielectric organics, low k dielectrics, air regions, silicon dioxide, silicon nitride, silicon oxyntride, silicon-rich silicon nitride, refractory metal oxides, and/or like layers of material.

Figure 4:
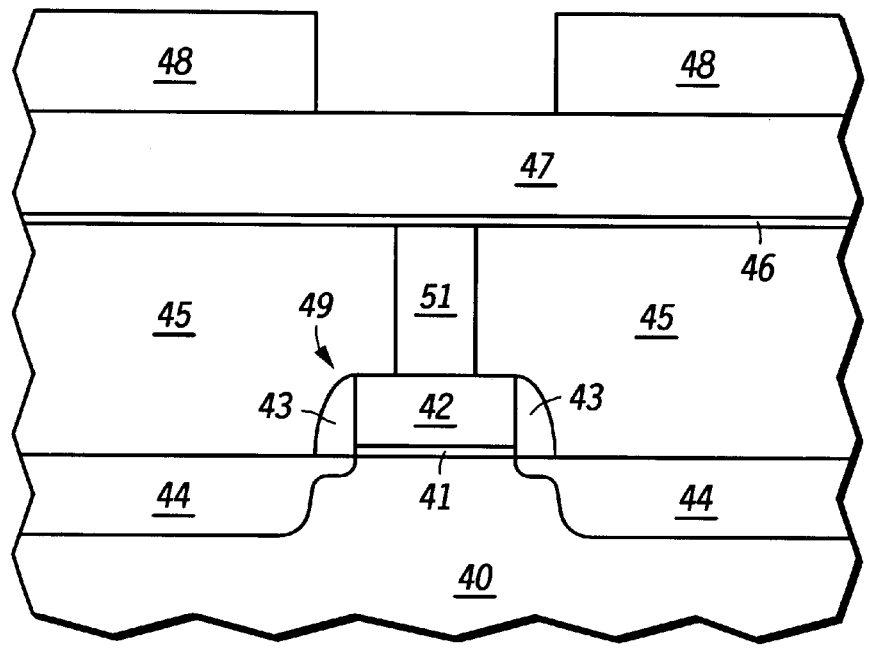
FIGS. 4–9 illustrate, in cross-sectional diagrams, integrated circuit structures represented at various stages of processing in accordance with FIGS. 1–3.

A typical structure resulting from the step 11 of FIG. 1 is illustrated in FIG. 4. FIG. 4 shows the IC substrate as a silicon substrate 40. Within the substrate 40 of FIG. 1 is shown a single active electrical device referred to as MOS transistor 49. The MOS transistor 49 has source and drain regions 44 which contain lightly doped drain regions (LDD regions) adjacent highly doped bulk current electrodes. Halo implants, threshold adjust implants, punch through implants, and like processing may also be used for the transistor 49. A channel region (un-numbered in FIG. 4) lies below a gate dielectric layer 41 so that the channel region is located laterally between the source and drain regions 44. A conductive gate electrode 42 above the gate dielectric 41 controls a conductivity of the channel region and therefore switches the MOS transistor 49 between the on and off state depending upon various voltage biases. A dielectric side wall spacer 43 is formed laterally adjacent a side wall of the gate electrode 42 to isolate the gate electrode, form self aligned contacts to regions 44, and/or to allow selfaligned formation of the LDD regions within electrodes 44. A first dielectric layer 45 is used to encapsulate the transistor 49 and contains various openings which connects to the gate electrode 42 and the current electrodes 44 (connections to layer 44 are not specifically shown in FIG. 4 since they occur out of the crosssection of FIG. 4). The current electrodes 44 and the gate electrode 42 are connected by tungsten plug regions 51 that fill the openings in layer 45 as shown in FIG. 4. The tungsten plug 51 and/or the dielectric layer 45 are formed by chemical vapor depiction (CVD) of material followed by chemical mechanical polishing (CMP) the result in the planar local interconnects required by the IC.

The specifics of step 11 of FIG. 1, which discusses the deposition of dielectric materials, etch stop layers, and/or ARC layers for the inlaid structure, is then specifically illustrated by layers 46–48 of FIG. 4. FIG. 4 illustrates an etch stop layer 46 which also functions as an antireflective coating (ARC) during lithographic operations. Etch stop layers and ARC layers may be formed as separate layers or may be formed by the same layer. Generally, the etch stop layer 46 is formed as a silicon nitride layer, a silicon oxynitride layer, a silicon rich silicon nitride layer, composites thereof, and/or a like etch stop material. A thicker layer 47 is then formed over a top of the etch stop layer 46. Preferably, the layer 47 is a fluorinated tetraethylorthosilicate layer (FTOS), a TEOS layer, borophosphosilicate glass (BPSG), phosphosilicate glass (PSG), a low K dielectric material, a spin on glass (SOG), a composite of any of these materials, or a like dielectric material. A photoresist layer 48 is then spin coated and patterned over a surface of the layer 47 as shown in FIG. 4. In summary of FIG. 4, FIG. 4 illustrates the formation of various layers references in step 11 of FIG. 1 where these layers are subsequently used to define an inlaid interconnect structure.

Figure 5:
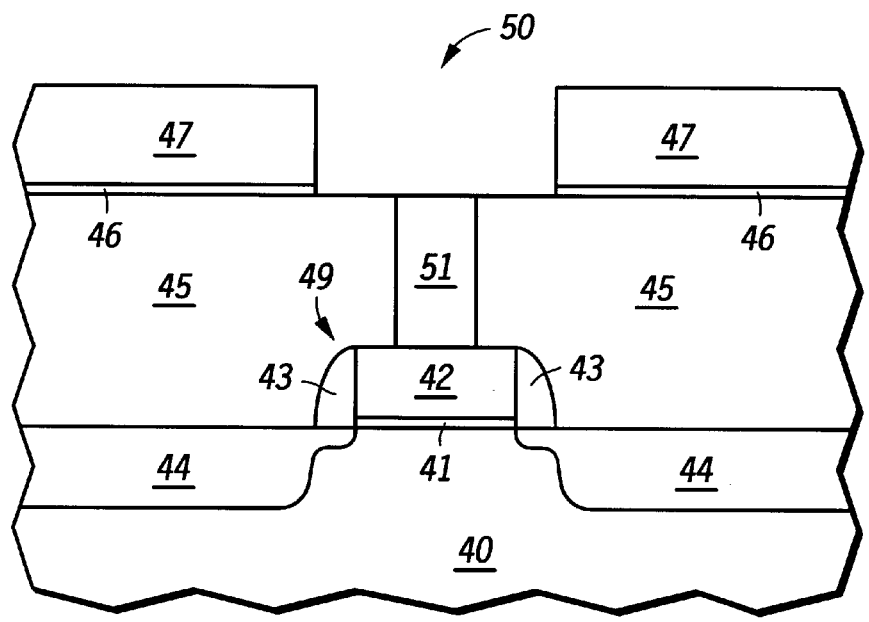

After performance of the step 11 in FIG. 1, a step 12 is performed. In step 12, an etch process is used after the formation of a masking layer 48 where layer 48 is generally a lithographically patterned photoresist layer. The etch process, performed in the presence of the masking layer 48, forms the inlaid structure as shown in FIG. 5. As previously discussed, FIG. 5 illustrates a single inlaid structure, however, it is important to note that a dual inlaid structure or any other inlaid embodiment may be manufactured using the process of FIG. 1. In summary of FIG. 5, FIG. 5 illustrates that portions of layers 47 and 46 that are exposed by the photoresist 48 are etched by a plasma or reactive ion etch (RIE) to form the inlaid formation 50 as shown in FIG. 5.

After etching of the inlaid structure in step 12 in FIG. 1, a barrier material is deposited in a step 13 of FIG. 1. Generally, the barrier material is any material that prevents subsequently formed copper material from contaminating adjacent dielectric layers or underlying active devices or vice versa. Barrier layers, as used herein, may be an additional layer deposited by any manner over the surface of the inlaid structure, may be an exposed surface portion of the inlaid structure that is treated by diffusion, doping, thermal processing, or implantation, to be a protective barrier region, or may be any other region that functions to protect the copper from the surrounding dielectric or vice versa. Deposited barrier layers that are generally used in the industry are tantalum nitride, titanium nitride, titanium/tungsten, tungsten, tantalum, composites thereof, or the like. The integrated circuit (IC) industry is currently using tantalum material as a preferred barrier layer for copper interconnects where the barrier is a few tens of angstroms to several hundred angstroms in thickness. Therefore, step 13 of FIG. 1 is used to form a tantalum barrier layer or like barrier region over the topography of the inlaid structure as illustrated by layer 61 in FIG. 6.

Figure 6:
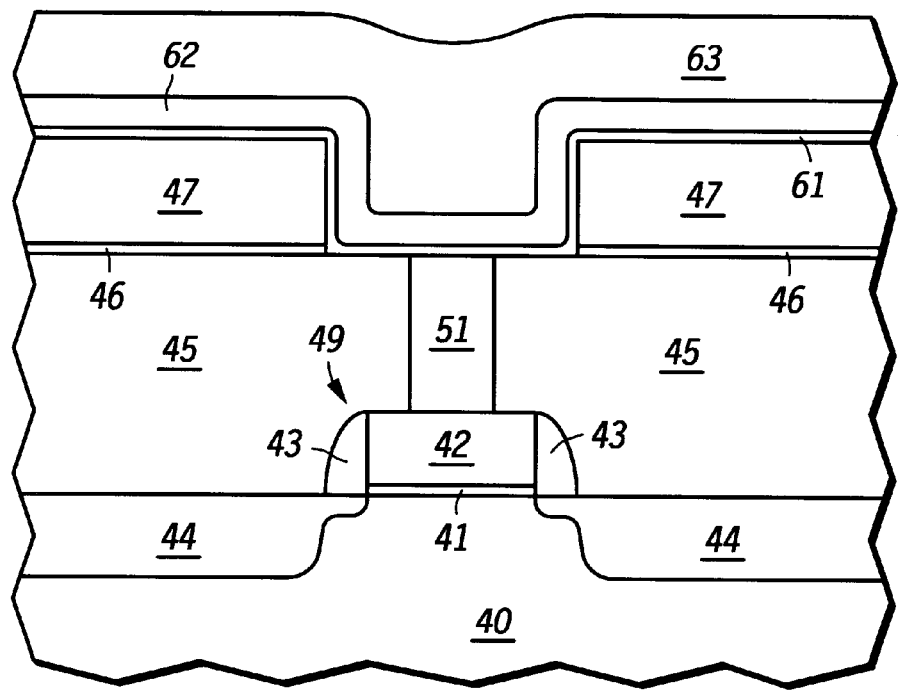

After formation of the barrier layer via step 13 of FIG. 1, a step 14 of FIG. 1 is performed. In step 14 of FIG. 1, a bulk copper film is deposited or formed over a top of the barrier layer. The formation of copper within the interconnect structure is generally illustrated in FIG. 6. FIG. 6 illustrates one embodiment where the formation of a CVD seed layer 62 is first performed. A thicker copper layer 63 is then electroplated or electrolysis plated over a top of the copper seed layer 62. In another embodiment, the layers 62 and 63 of FIG. 6 may be replaced by a single thick CVD copper layer. Furthermore, the layers 62 and 63 may be replaced by any other copper layer formed by another method or a copper composite material (e.g., copper/silicon).

Figure 7:
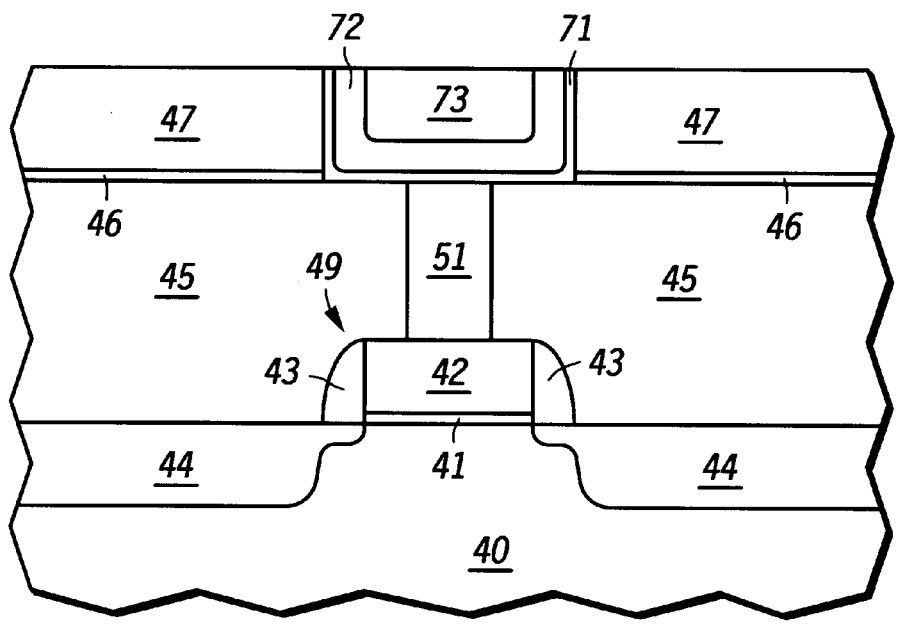

After formation of the bulk copper material 62 and 63 in FIG. 6, a step 15 of FIG. 1 is used to polish the layers 61–63 in FIG. 6. Generally, the polishing process represented by step 15 of FIG. 1 results in a structure similar to that illustrated in FIG. 7. In FIG. 7, top portions of all three of the layers 61–63 have been polished to some extent. Specifically, the barrier layer 61 has been polished to form a polished barrier layer 71 and the copper layers 62 and 63 have been polished to form a copper interconnect region 72 and 73. Generally, the CMP process illustrated structurally in FIG. 7 and illustrated via a flow chart step 15 in FIG. 1 may be performed by a "two-step" process illustrated in more detail in FIG. 2 or a "three-step" CMP process illustrated and discussed in more detail with respect to FIG. 3.

Discussion of the specific two-step process (FIG. 2) and discussion of the three-step process (FIG. 3) within step 15 of FIG. 1 is reserved for later paragraphs.

After completion of all polishing operations of the interconnect structure as indicated by step 15 of FIG. 1 and illustrated in FIG. 7, FIG. 1 indicates that steps 11–15 are repeated via a step 16 if step 16 determines that more interconnect layers are to be formed within the integrated circuit. Current integrated circuit (IC) devices are being manufactured that contain seven or eight layers of interconnecting metallurgy over active devices. Therefore, the steps of FIG. 1 may be used to form a single interconnect layer in isolation or may be used to form eight or more stacked copper interconnect layers as are required by a specific integrated circuit design.

Figure 8:
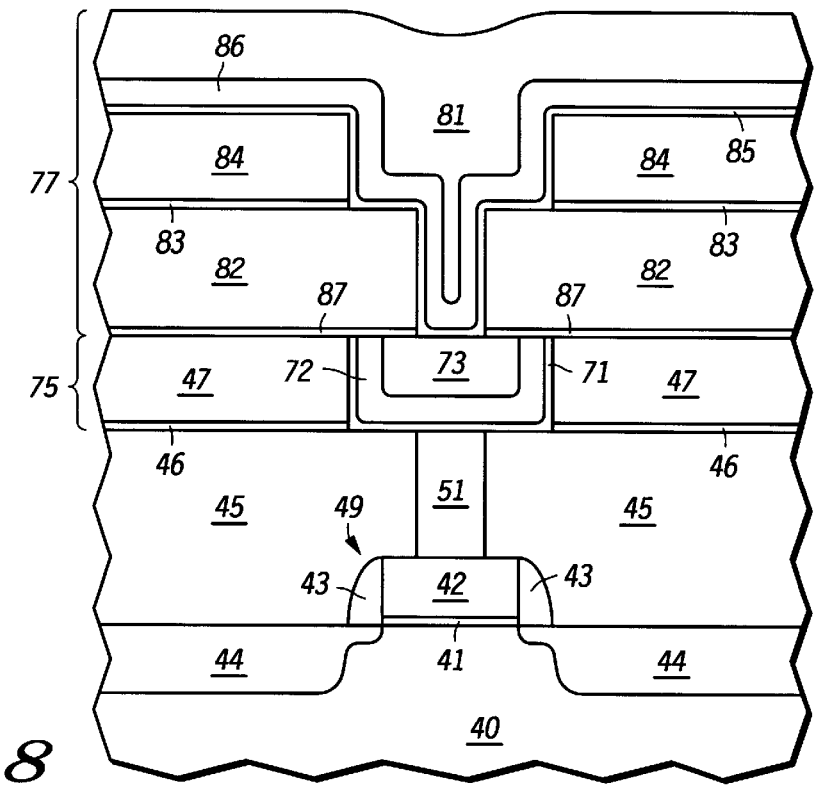

To illustrate the stacking of interconnects through use of the process of FIG. 1, FIG. 8 illustrates a semiconductor device that contains at least two inlaid layers formed on top of each other where each inlaid layer is formed via the process illustrated by FIG. 1. Specifically, FIG. 8 illustrates a single inlaid first interconnect structure 75 previously discussed via FIGS. 4–7 and a dual inlaid second interconnect structure 77 that overlies the structure 75. In FIG. 8, another barrier layer 87 is formed over the first interconnect structure 75. The layer 87 is generally analogous to the barrier layer 46. Over the layer 87 is formed a thicker dielectric layer 82 which is analogous to the layer 47. A second etch stop layer and anti-reflective layer 83 is formed over the layer 82 as illustrated in FIG. 8. The layer 83 is analogous to the layer 46. Over the layer 83 is formed a thicker dielectric layer 84 which is analogous to the previously discussed dielectric layers 47 and 82. After formation of the layers 82, 83, 84, and 87, one or more lithographic and etch processes are used to form an interconnect trench structure through the layer 84 and contact via openings through the layer 82 that together make a dual inlaid interconnect structure 77.

After removal of selective portions of the layers 82, 83, 84, and 87, a barrier layer 85 is deposited within the dual inlaid structure 77. As previously discussed (see FIG. 6), a copper bulk layer 81 and 86 is then formed over a top of the barrier layer 85. The layer 86 of FIG. 8 is analogous to the layer 62 of FIG. 6 and the layer 81 of FIG. 8 is analogous to the layer 73 of FIG. 6. After formation of the layers 85, 86, and 81 in FIG. 8, a chemical mechanical polishing (CMP) process, as illustrated in step 15 of FIG. 1, is used to form a dual inlaid copper interconnect 77 as shown in FIG. 9.

Figure 9:
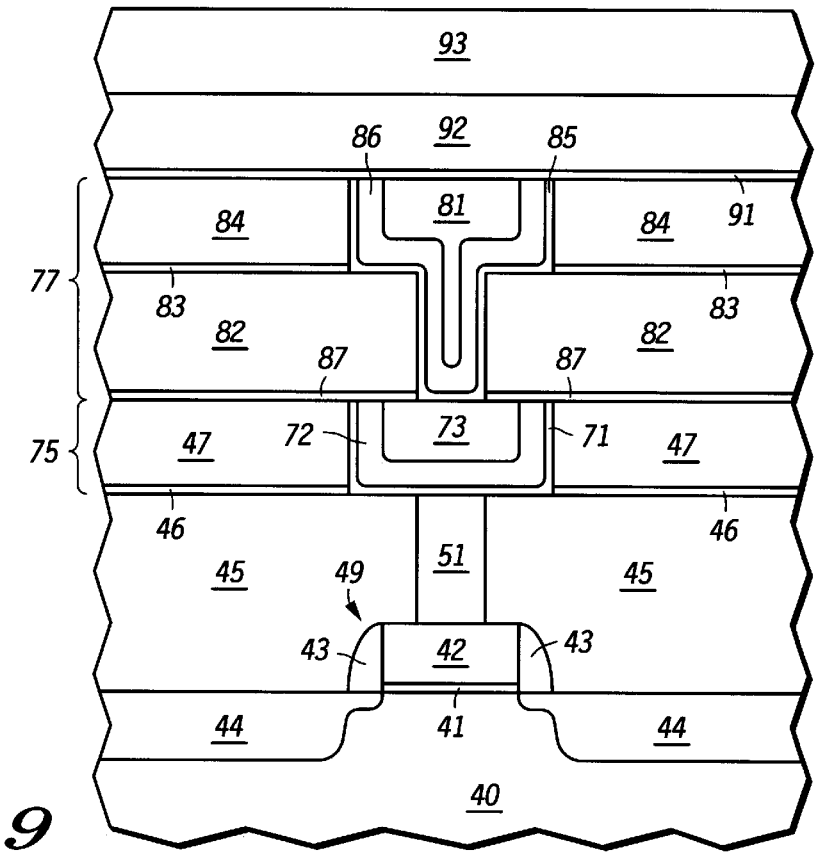

Once the step 16 of FIG. 1 determines that no more interconnect layers are required within the IC, the passivation processing of FIG. 9 is performed. FIG. 9 illustrates that the top interconnect layer 77 is passivated with a barrier layer 91. In a preferred form, the barrier layer 91 is a plasma enhanced nitride (PEN) layer. Over the barrier layer 91 is formed a passivation layer 92 which is preferably a silicon nitride layer or a silicon oxynitride layer. A polyimide layer 93 is a final passivation layer that is formed over the layer 92. The device of FIG. 9 is then packaged into an integrated circuit package or connected to a printed circuit board in order to form a larger electrical system.

Figure 2:
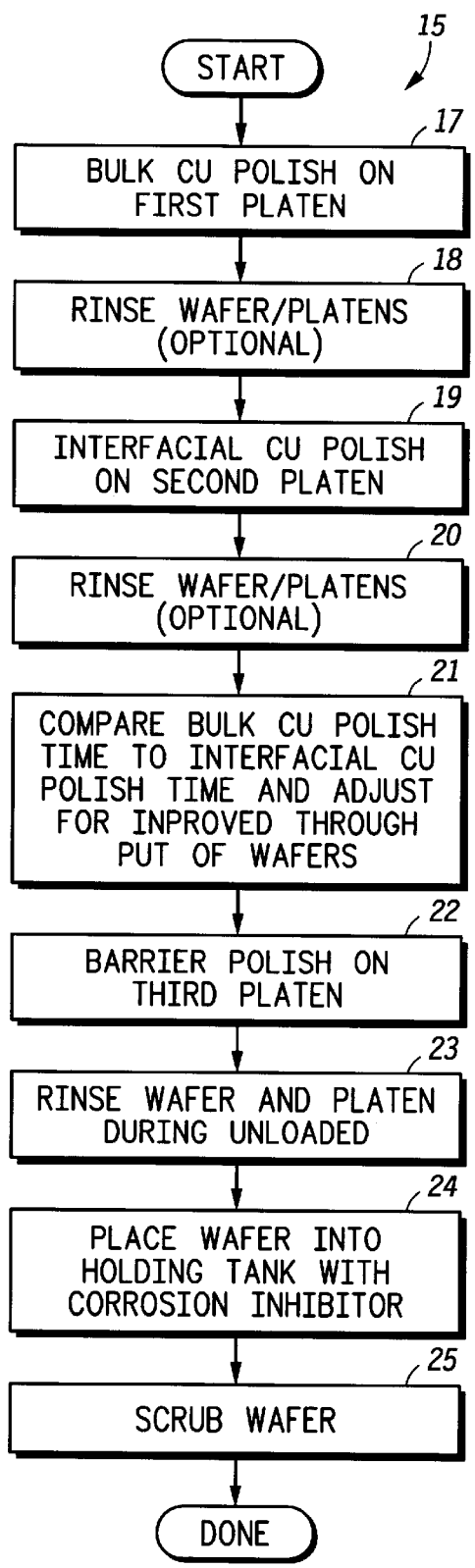
FIG. 2 illustrates, in a flow chart, a two-step method of polishing an inlaid structure within the process of FIG. 1.
Figure 3:
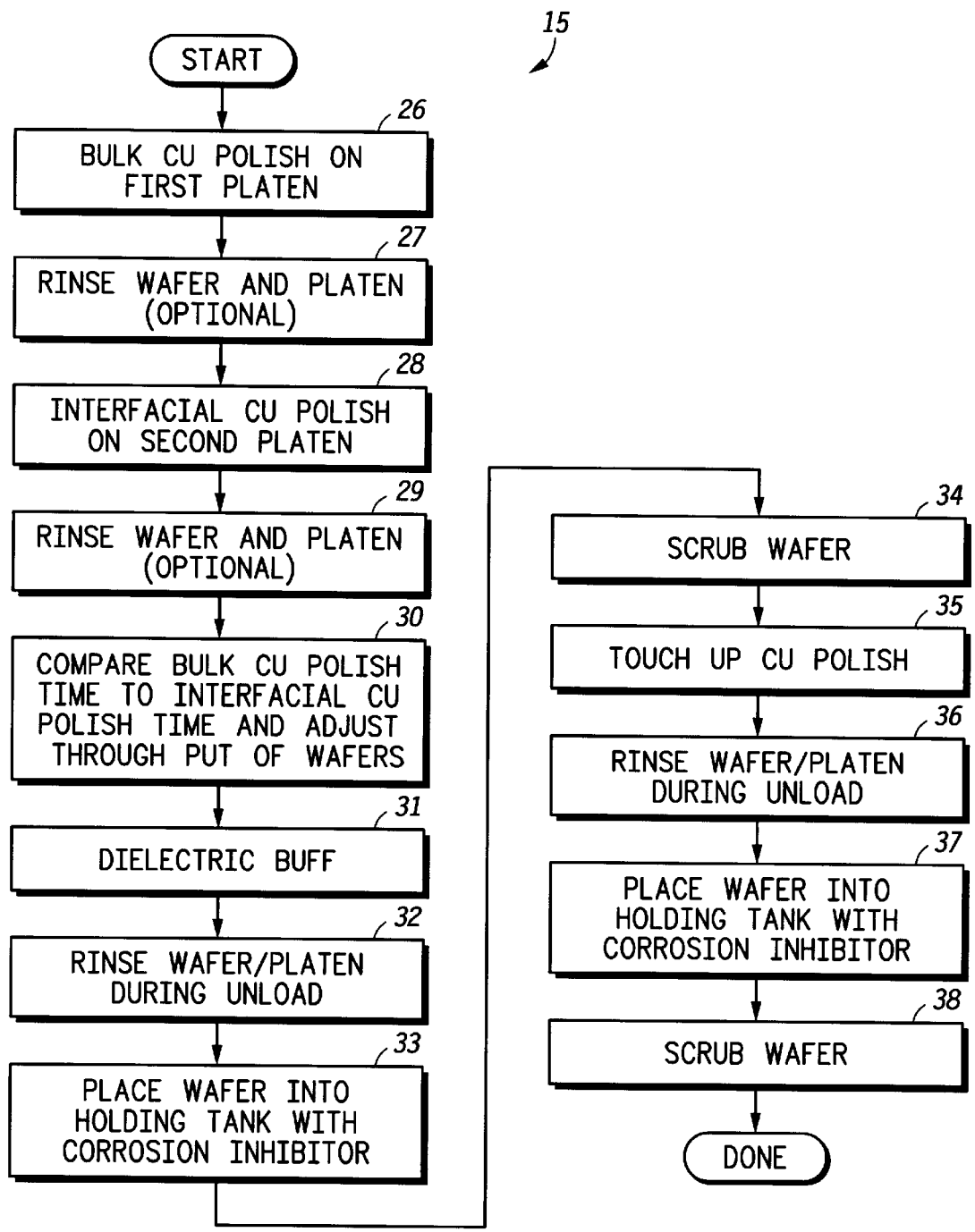
FIG. 3 illustrates, in a flow chart, a three-step method for polishing a copper inlaid structure within the process of FIG. 1.

Returning to step 15 of FIG. 1, the polishing process illustrated in step 15 in FIG. 1 is performed by one of either the two-step CMP process illustrated in FIG. 2 or the three-step CMP process illustrated in FIG. 3 (or some hybrid thereof).

FIG. 2 illustrates what is referred to as a "two-step" copper interconnect polishing process that begins with a copper polish operation (the "first step") and ends with a tantalum polish operation (the "second step", thus the term "two step" polish). In one form, the process of FIG. 2 is used to perform the polishing discussed previously via step 15 of FIG. 1.

FIG. 2 begins by performing a higher speed bulk copper polish on a first platen within a CMP system. Generally, the polishing taught herein was experimentally performed on an Applied Mirra CMP system which is commercially available in the market at this time. A first platen on this polishing system was dedicated for use as a bulk copper polish platen as illustrated in step 17 of FIG. 2. In order to enable bulk copper removal, this first platen was provided with a first slurry. The first slurry generally comprised an alumina abrasive, an oxidizer, and a corrosion inhibitor. Specifically, the alumina abrasive used in experimentation was a W400 alumina abrasive, the oxidizer that was utilized in the first slurry was hydrogen peroxide (H2O2), and the corrosion inhibitor was 1, 2, 4 triazole. In addition, ammonia citrate (NH4 citrate) is added to the first slurry as an additional complexing agent. While these specific compounds were used, any other slurry composition may be used as long as that CMP slurry enables a fast copper removal rate.

In step 17 of FIG. 2, a polishing pressure of roughly 2–6 pounds per inch (psi) is applied between the wafer and the platen. In a preferred form, a polishing pressure of greater than 4 psi is used in step 17 of FIG. 2 to result in the faster copper removal rate. A platen rotational speed of 30 to 150 rotations per minute (RPM) is used in the polishing of step 17. In addition, a slurry flow onto the platen of roughly 50 to 500 milliliters per minute (ml/min) is utilized. The polishing process 17 of FIG. 2 is generally a timed polishing process which does not need to be optically endpointed or endpointed in any manner. However, other embodiments of step 17 may utilize some manner of endpoint detection to terminate the process step 17 of FIG. 2. When a timed polish is used, polishing times of roughly 30 seconds to 2 minutes are used for conventional thicknesses of the layers 86 and 81 shown in FIG. 8. A typical polishing pad that may be used for performing the polish 17 of FIG. 2 is an IC1000 or IC1010 CMP pad manufactured by Rodel.

The polish process step 17 of FIG. 2 is designed to remove a significant top portion of the copper material 86 and 81 from the surface of the structure illustrated in FIG. 8 at a high rate of removal. Generally, the step 17 of FIG. 2 is designed to result in a copper removal rate of at least 1000 angstroms per minute with removal rates of 3,000 angstroms/min to 10,000 angstroms per minute being most likely. Step 17 of FIG. 2 is designed to remove a substantial portion of the layer 81 whereby less than roughly a 2000 angstrom thickness of copper remains over a top of the uppermost portion of the barrier layer 85 in FIG. 8.

After bulk polishing via a step 17 of FIG. 2 is complete, the wafer is removed from the first platen in a step 18. At this point, an optional deionized (DI) water rinse or like wet clean is performed on the wafer. This wet cleaning process is performed at a station located between the first platen and the second platen in one embodiment. When cleaning a wafer, it has been found that the wafer cleaning stations located between two platens may scatter contamination onto the adjacent platens. In the cases where such slurry cross-contamination is ill-advised, an optional platen rinse may be performed in step 18 in addition to the rinsing of the wafer. Therefore, one or more of the first and second platens discussed in FIG. 2 may be simultaneously rinsed along with the wafer in order to reduce cross contamination between the first and second platen as is necessary to maintain process integrity. In some embodiments, the first and second platens may be using compatible slurries whereby no rinsing at all is needed between the first and second platen (thus this step is optional).

After the polishing process of step 17 and the optional rinse step 18, a slower interfacial copper polish process is begun on the second platen within the CMP tool. In step 19, the wafer is placed onto the second platen where the second platen is exposed to a slurry substantially similar in concentration and content to that used in step 17. In another embodiment, the slurry used on the first and second platen may be completely different from each other as long as both these slurries are copper removal slurries. For example, the slurry used in conjunction with the first platen is likely not concerned with selectivity to the barrier layer. However, it is more likely that the slurry applied to the second platen will be engineered for a proper selectivity to the barrier material. In another form, the slurry used in step 19 is identical to the slurry used in step 17 and is dispensed from the same reservoir.

In order to result in a slower polishing operation in step 19 when compared to step 17, a polishing down force used in step 19 is generally less than the down force used in step 17 and ranges any where from 0.5 to 4 pounds per square inch (psi). Generally, the process of step 19 may be altered in any manner that results in a slower polishing process than that used in step 17. For example, the platen rotational speed may be altered between steps 17 and 19 and/or a chemical composition of the slurry may be changed to result in more chemical copper removal in step 17 when compared to step 19. Generally, the step 19 is used to remove a last remaining few hundred to few thousand angstroms of copper that remains over an uppermost portion of the barrier layer 85 within interconnect structure 77 of FIG. 8. In one form, the polishing process of step 19 in FIG. 2 is endpointed. The endpoint operation which is currently utilized is an optical endpoint process which impinges an energy source onto the wafer through the polishing pad in order to measure a reflectivity of the wafer. As the copper is removed from the wafer over time to expose an underlying portion of the barrier layer 85, the reflectivity of this energy source from the surface of the wafer will measurably change. Upon the detection of this change in surface reflectivity, the polishing process can be terminated whereby optical endpoint is achieved. The polishing process of step 19 exposes a top portion of the barrier layer.

After performance of the polishing step 19, an optional rinse step 20 is utilized. Generally, the CMP slurries used to polish copper via step 17 and 19 is radically different and chemically incompatible with the chemical composition of the slurry used to subsequently polish barrier materials. In these cases, it is advantageous to ensure that contamination from one copper polishing platen is not deposited on the other barrier polishing platen. To avoid this cross contamination, the wafer, upon removal from the second platen may be rinsed with deionized (DI) water or a like wet chemistry when in transfer between the second platen and the third platen. In addition to rinsing the wafer, one or more various adjacent platens (especially the second platen and/or the third platen), may also be rinsed along with the wafer. This rinsing of one or more of the wafer, the second platen, and/or the third platen, has been shown to significantly reduce cross contamination between platens whereby copper interconnect planarity and defectivity is improved while simultaneously increasing the throughput and reducing the downtime of the CMP tool.

The two-step copper polishing process of steps 17 and 19 across three or more different platens was performed for CMP wafer throughput reasons. If a large portion of the copper material can be removed by a CMP process having a high rate of removal via step 17, then another platen may be used by step 19 to more carefully perform the more sensitive removal of the interfacial copper at the barrier-copper interface. Therefore, while the processes taught herein may polish the entire copper material using a single platen and a single polish step in one embodiment, using the two platens for copper polishing in FIG. 2 has advantages. In order to maximize the throughput of the system, it is important to keep the polishing time of the step 17 approximately equal to the polishing time of the step 19. Specifically, it is an improvement to keep the polishing process time of step 17 and the polishing process time of step 19 within roughly 20% variation of one another.

In another form, a robotic arm that loads wafers onto the first platen of the CMP machine has a fastest load time period (e.g., it may take 30 seconds for a robotic arm to manipulate a wafer from a wafer carrier to the first platen). In these cases where throughput is mechanically limited, it is adequate for maximal throughput to simply ensure that both of the polish times for the steps 17 and 19 remain below this threshold period. As an example, if a robotic arm can load a wafer onto the first platen every 30 seconds, it would be an improvement for throughput to ensure that both the polish times occurring in steps 17 and 19 are below 30 seconds to avoid stoppage of wafer progress through the system. Furthermore, if the polishing processes take longer than the fastest load time by necessity, it is likely that throughput will not be optimal if the polish process of step 17 takes two minutes while the polish process of step 19 takes fifteen seconds. In this lopsided case, it would be advantageous for throughput reasons to reduce the amount of polishing occurring at step 17 and move more burden of polishing to the step 19. In the above example, it would be better to polish with step 17 for 45 seconds and polish with step 19 for 45 seconds as opposed to the 2 minute/15 second lopsided polish. The equilibration or monitoring of polishing times between step 17 and step 19 is important in order to maximize throughput for different lots of wafers and process variations. Such balancing or monitoring of cross-platen polish times prevents or reduces bottlenecks associated with any one platen on the polishing tool.

The balancing of the polishing times between steps 17 and 19 (or the detection of one of these times extending beyond the mechanical fastest load time) is performed by a step 21 of FIG. 2. In step 21 of FIG. 2, a computer which is coupled to the CMP tool monitors a polishing time of step 17 and also monitors the optical endpoint polishing time of step 19. Step 21 will then compare, via the computer, the time of polishing from step 17 and the time of polishing in step 19 to each other and/or compare both these polishing times to the mechanical threshold time determined by the speed of wafer loading in the system. If the computer determines that appropriate trade-offs can be made between the polishing time of step 17 and the polishing time of step 19 to improve throughput, then the computer will either in situ change the parameters of one or more of the polishing step 17 and 19 to result in such a change or instruct an operator or CMP engineer to make such adjustment in a manual manner on a wafer-by-wafer or lot-by-lot manner. Changes in polish times may be accomplished by changing endpoint criterion, changing the amount of time the wafer is exposed to the platen, or changing one or more process parameters such as platen RPM, slurry flow, down pressure, slurry composition, and/or like process parameters one or more platens.

After adjustment of the polishing times in steps 17 and 19 via the step 21 (if any such adjustment is necessary), a barrier polishing process is performed in a step 22 of FIG. 2. In step 22, the wafer is placed on a third platen and is polished using a barrier polishing slurry. Generally, the barrier polishing slurry contains a silica abrasive, a corrosion inhibitor, and some sort of pH adjuster. In one form, the silica abrasive can be the commercially available abrasive referred to as SCE and provided by Cabot. In one form, the corrosion inhibitor may be 1, 2, 4 triazole, while the pH adjuster may be ammonium hydroxide (NH4OH). It has been found pH shock, contamination, and corrosion can be reduced when forming the copper interconnects by changing the pH of the barrier slurry to a non-neutral pH between 2 and 11. Preferably, a pH range from 8 to 9, which is fixed primarily by the ammonia hydroxide, has been found to be sufficient to prevent corrosion when used in conjunction with greater than 2 percent of 1, 2, 4 triazole. Generally, it was found that pH levels between roughly 6 and 8 (near neutral) when using no triazole or triazole less then 2 percent triazole by volume resulted in significant corrosion of copper interconnect structures over time. Therefore, a careful adjustment of the pH outside of values near 7 and/or the use of greater volumes of corrosion inhibitors has greatly improved the reliability and yield of copper interconnect structures beyond that possible in the art.

A typical range used for the polishing down pressure for the barrier polishing of step 22 is between 0.5 and 6 pounds per square inch (psi). It has been found that roughly 3 psi of polish down pressure produces acceptable interconnect results. A typical platen speed used for the barrier polish in step 22 of FIG. 2 is any speed between roughly 30 and 150 rotations per minute (RPM). A typical slurry flow that is used for the barrier polish in step 22 is anywhere from 50 to 500 milliliters per minute (ml/min). Generally, the barrier polish 22 is a timed polish that is statically set between roughly 30 seconds and 2 minutes. Of course, the polish time period depends on a thickness that is used for the barrier layer being polished. In another form, some form of endpoint or optical endpoint may be used to terminate the barrier polishing process in FIG. 2. A typical polishing pad that has been used to perform barrier polishing with good results is an embossed politex pad provided by Rodel. The barrier polishing process taught herein has been shown to reduce leakage between interconnect structures. It is believed that the polishing process taught herein has reduced potassium contamination along a surface of the interconnect surface after barrier polishing is complete. This reduction in potassium contamination is believed to reduce leakage current between interconnect structures whereby the yield of integrated circuits is improved and long term IC reliability is enhanced.

After the barrier polish process of step 22 in FIG. 2, an optional wafer rinse and platen rinse is performed during wafer unload operations. This rinsing operation of step 23 is performed since many CMP tools will move a wafer over other platens during the step of unloading the wafer from the CMP system. To avoid cross contamination between platens, all platens over which the wafer robotic arm will travel and the wafer itself are optionally exposed to a rinse operation via step 23.

After the optional rinse process represented by step 23, the wafers are placed into an unload station (holding tank) that exposed the wafer to a holding fluid. The holding fluid contains corrosion inhibitor additives. In the prior art, the holding fluid does not contain corrosion inhibitor additives. It has been found that if the wafers remain in the unload station for extended periods of time, corrosion and contamination of the copper layer can be extensive and IC yield is adversely reduced. Therefore, in the prior art, it is important to quickly process wafers through the unload station after barrier polish is complete. It has been found that inadvertent maintenance delays, bottlenecks in fabrication facility processing, equipment down time, human error, and other uncontrollable and/or unfortunate situations in fabrication processing have resulted in many copper interconnect wafers sitting too long on the unload station, whereby yield is reduced and the cost of implementing a copper process is inversely increased.

In order to smooth these bottlenecks, improve yield, reduce cost, and improve throughput of a wafer fabrication facility, a method was needed to provide longer shelf life for copper materials between barrier polishing operations and wafer scrub procedures (or other critical processing steps). The extension of the queue time while reducing corrosion and contamination is the function of the step 24 illustrated in FIG. 2. By placing the wafers into a fluid holding tank that contains corrosion inhibitors such as 1, 2, 4 triazole, wafers can be maintained for much longer periods of time between the barrier polish step 22 and the wafer scrub step 25. Therefore, the wafer holding tank of step 24 has reduced the likelihood of corrosion and improved the feasibility of copper processing and mainstream integrated circuit manufacturing.

After storage in the holding tank via step 24, a step 25 of FIG. 2 is utilized. In the scrubbing step 25, a scrubbing apparatus is used that has two brush stations. The wafer is first loaded into a first brush station and mechanically brushed and wet etched for roughly 15 to 50 seconds. After a first brush station is complete, a second mechanical brush station is used to scrub the wafer via wet chemicals and mechanical agitation for yet another time period of roughly 15 to 50 seconds. It is important to note that any number of mechanical stations from one to many may be used to perform the scrubbing operations taught herein. In addition, the mechanical/brush scrubbing operations taught herein may be replaced with ultrasonic or other methods of wafer scrubbing/cleaning.

After performing various ultrasonic and/or mechanical brush scrub operations, a third chamber of the scrubbing tool or a separate machine is used to dry one or more scrubbed wafers for subsequent processing. Typically, within drying processes used for aluminum interconnect processing and all known processes currently used for copper interconnects, a light source has been used within the spin rinse chamber to reduce drying times and increase wafer throughput. It was found that the provision of a high powered light within the spin rinse chamber dried wafers much faster than without the light whereby the light has generally become a standard in the art. However, with the use of copper interconnects, it has been found that the presence of substantial amounts of light within the spin rinse and drying chamber of the scrub equipment is disadvantageous. Specifically, it has been found and is believed that the light within this chamber induces a photovoltaic effect that results in creation of corrosion across the copper interconnects. For this reason, it has been found that a darker spin rinse process that is substantially void of light is better for the newer copper interconnects. While the substantial reduction and/or complete removal of the light from the drying chamber of the scrubbing apparatus has slightly extended drying times and impacted throughput contrary to the desires of the prior art, it was found that the advantages of reducing corrosion outweighed this slight lengthening of the drying time. In addition, the adverse impact to throughput by removal or lack of use of the light has been reduced or eliminated by funneling hot air onto the surface of the wafer during the spin rinse cycle. Generally, it was found that any energy source that does not invoke or does not create a photoelectric effect on the copper interconnects can be used to speed the drying process through the scrubbing step 25 of FIG. 2 whereby throughput can be maintained while corrosion is significantly reduced.

After the scrubbing of the wafer via step 25, processing of the single inlaid or dual inlaid structure is complete. It has been found that the process, discussed with respect to FIG. 2, results in improved planarity and reduced dishing within copper interconnects. Because dishing and erosion are reduced, many contact vias can be placed directly on top of one another as illustrated in FIG. 9. In general, it has been found that as many as seven via connections can be placed on top of one another whereby the dishing and erosion that occurs in prior art CMP processes would render such a structure impossible to form. Therefore, there are some additional structural integrated circuit benefits to using the chemical mechanical polishing process taught herein that may have the advantage of reducing overall IC dimensions via implementation of more efficient routing of vias and interconnects.

FIG. 3 illustrates a "three step" polishing process that may be used for the step 15 of FIG. 1 in lieu of the "two step" process of FIG. 2. FIG. 3 is referred to as a "three step" process since a copper polish is followed by a tantalum process which is followed by another copper polish.

In FIG. 3, the steps 26–30 are substantially similar to that discussed previously via steps 17–21 of FIG. 2. Therefore, these steps are not addressed in detail again for FIG. 3. However, FIG. 3 differs from FIG. 2 via the step 31 of FIG. 3. In step 31, the wafer is exposed to a dielectric buff that removes exposed portions of the barrier layer and portions of the oxide that underlie the barrier layer. In one form, the dielectric buff step 31 uses a commercial dielectric CMP slurry such as SC112 or SS12 available from Cabot. A typical range used for the polishing down pressure within step 31 is between 0.5 and 6 pounds per square inch (psi) with a pressure of about 3 being typical. A typical platen speed used for the barrier polish in step 31 of FIG. 3 is any speed between roughly 30 and 150 rotations per minute (RPM). A typical slurry flow that is used for the step 31 is anywhere from 50 to 500 milliliters per minute (ml/min). Generally, the barrier polish 31 is a timed polish that is statically set between roughly 30 seconds and 2 minutes with one minute being typical. Of course, the polish time period depends on a thickness that is used for the barrier layer being polished and the amount of underlying oxide/dielectric that is targeted for removal. In another form, some form of endpoint or optical endpoint may be used to terminate the buff step 31 in FIG. 3. A typical polishing pad that has been used to perform this buffing process with good results is an embossed polytech pad provided by Rodel.

After dielectric buffing, steps 32–34 are analogous to steps 23–25 of FIG. 2. Therefore, these steps are not discussed further with respect to FIG. 3. However, the dielectric buffing step 31 is generally done with a silica slurry that contains potassium and does not complex copper. It is believed that oxide potassium contamination from this slurry adversely increases leakage currents in the final IC device. In order to reduce this leakage effect due to the presence of surface potassium, a touch up copper polish is performed by a step 35 in FIG. 3. In step 35, any alumina CMP slurry such as the exact slurry taught in step 17 of FIG. 2 for the bulk copper removal is used for the step 35 of FIG. 3. One difference between step 17 and step 35 is that the polishing pressure of step 35 is very low (e.g., 0.2 to 0.8 psi with 0.4 to 0.5 being most typical). In addition, the polishing of step 35 is very brief when compared to step 17 (e.g., step 35 polishes for a time period of less than twenty seconds with ten seconds being typical). When incorporating the step 25, leakage current was improved in the final IC device.

After the touch up polish of step 35, the steps 36–38 are performed. Steps 36–38 are analogous to the steps 32–34 of FIG. 3 or the steps 23–25 of FIG. 2.

Although the invention has been described and illustrated with reference to specific embodiments, it is not intended that the invention be limited to those illustrative embodiments. Those skilled in the art will recognize that modifications and variations may be made without departing from the spirit and scope of the invention. Therefore, it is intended that this invention encompass all of the variations and modifications as fall within the scope of the appended claims.

What is claimed is:

1. A method for forming an interconnect comprising:
   forming a copper containing interconnect over a semiconductor device substrate, wherein forming the copper-containing interconnect includes removing portions of a copper containing layer using a polishing process;
   cleaning the semiconductor device substrate using a wet cleaning process; and
   drying the semiconductor device substrate after cleaning the semiconductor device substrate, wherein drying is performed in an environment that is substantially void of visible light.

2. The method of claim 1, wherein drying the semiconductor device substrate further comprises rotating the semiconductor device substrate about a central axis of the semiconductor device substrate.

3. The method of claim 1 wherein drying the semiconductor device substrate further comprises flowing heated air across a surface of the semiconductor device substrate while rotating the semiconductor device substrate.

4. The method of claim 1 wherein drying the semiconductor device substrate further comprises applying an energy source to the semiconductor device substrate, and wherein the energy source does not induce a photovoltaic effect on the interconnect.

5. The method of claim 1, wherein cleaning further comprises ultrasonically cleaning the semiconductor device substrate.

6. The method of claim 1 wherein cleaning further comprises mechanically scrubbing the semiconductor device substrate.

7. A method for forming a metallic interconnect comprising:
   forming the metallic interconnect over a semiconductor substrate using a polishing process;
   storing the semiconductor substrate having a metallic interconnect in a holding tank that contains fluid, the fluid containing a copper corrosion inhibitor;
   removing the semiconductor substrate from the holding tank; and
   scrubbing the semiconductor substrate.

8. The method of claim 7, wherein the inhibitor is further characterized as 1, 2, 4 triazole.

9. The method of claim 7, wherein the holding tank is periodically refreshed at intervals in a range of approximately 2–24 hours.

* * * * *